(12) United States Patent
Kunitomo et al.

(10) Patent No.: US 6,632,583 B2
(45) Date of Patent: Oct. 14, 2003

(54) OPTICAL RECORDING MEDIUM AND PRODUCTION METHOD OF THE SAME

(75) Inventors: Haruo Kunitomo, Kurashiki (JP); Takashi Ohno, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 48 days.

(21) Appl. No.: 09/730,514

(22) Filed: Dec. 5, 2000

(65) Prior Publication Data

US 2001/0003641 A1 Jun. 14, 2001

(30) Foreign Application Priority Data

Dec. 7, 1999 (JP) .......................... 11-347488
Mar. 16, 2000 (JP) ........................ 2000-073865

(51) Int. Cl.[7] .................. G11B 7/24; C23C 14/34; C23C 14/06
(52) U.S. Cl. ............... 430/270.13; 430/945; 428/64.6; 369/275.5; 369/275.2; 204/192.15; 204/192.22; 204/192.25
(58) Field of Search ............... 430/270.13, 945; 369/275.5, 275.2; 428/64.6; 204/192.15, 192.22, 192.26

(56) References Cited

U.S. PATENT DOCUMENTS 4,670,345 A * 6/1987 Morimoto et al. .......... 430/945
5,453,346 A * 9/1995 Kawahara et al. .......... 430/945
5,479,382 A * 12/1995 Nishida et al. ........... 369/275.2
5,581,539 A * 12/1996 Horie et al. ............. 369/275.4
6,221,557 B1 * 4/2001 Harigaya et al. ...... 430/270.13

FOREIGN PATENT DOCUMENTS

| FR | 2466497 | * | 4/1981 |
| JP | 05-217212 | * | 8/1993 |
| JP | 2000011450 | * | 1/2000 |

OTHER PUBLICATIONS

Sella, et al., "RF sputtered luminescent rare earth and yttrium oxysulfide films", Thin Solid Films vol. 90(2) pp 181–185 (1982).*

Maple et al., "RF sputtered luminescent rare earth oxysulfide films", J. Vac. Sci. Technol. vol. 10(5) pp. 616–620 (Sep. 1973).*

* cited by examiner

Primary Examiner—Martin Angebranndt
(74) Attorney, Agent, or Firm—David G. Conlin; John B. Alexander; Edwards & Angell, LLP

(57) ABSTRACT

The present invention relates to an optical recording medium having a protective layer and a phase-change recording layer on a substrate, said protective layer containing a metallic oxysulfide and an optical recording medium having a protective layer and a phase-change recording layer, said protective layer being formed by sputtering using a target comprising a metallic oxysulfide.

25 Claims, 5 Drawing Sheets

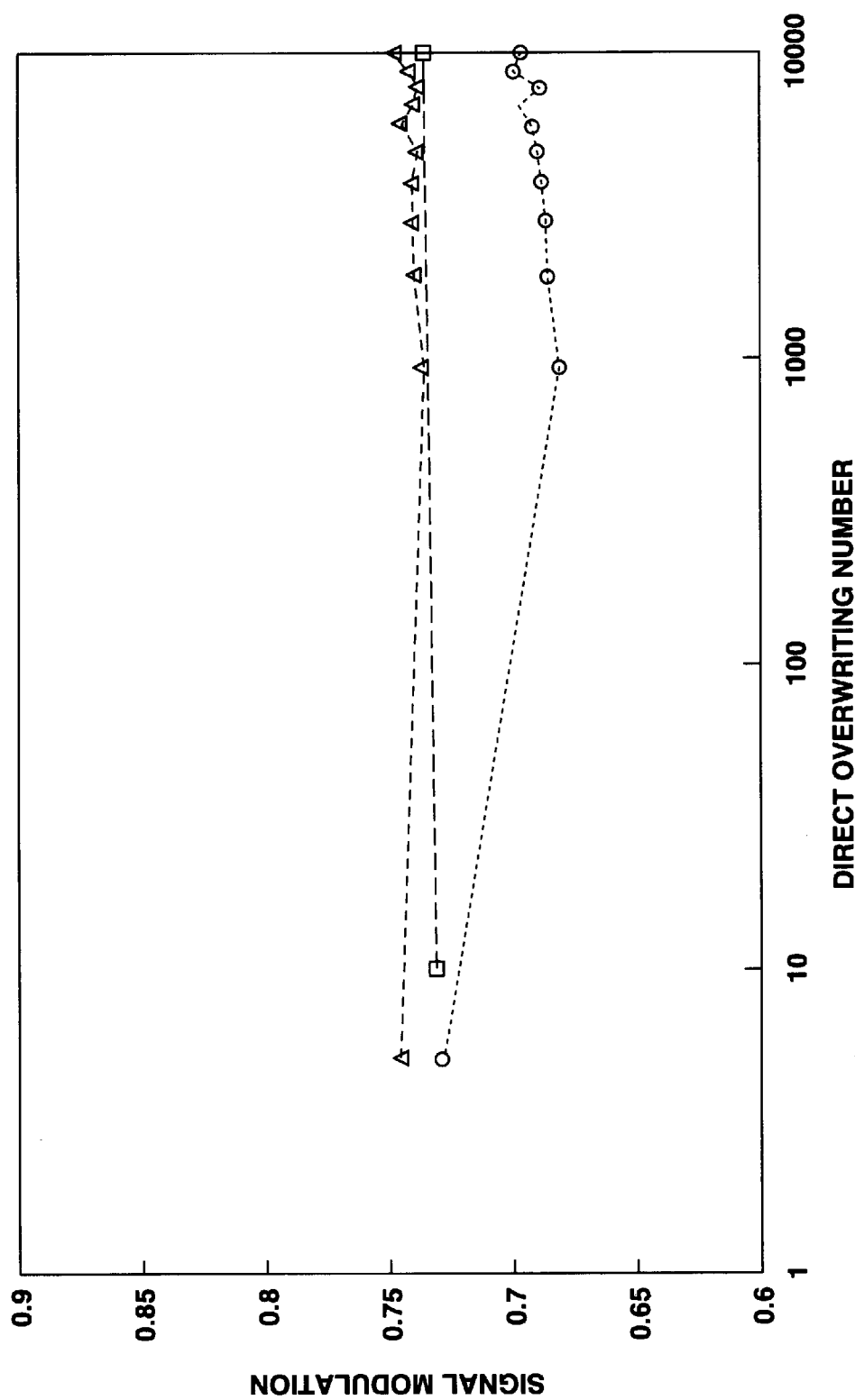

OPTICAL RECORDING MEDIUM AND PRODUCTION METHOD OF THE SAME

BACKGROUND OF THE INVENTION

The present invention relates to an optical recording medium and its production method. More particularly, it relates to an optical recording medium which is capable of high-speed and high-density recording, erasing and retrieving of information by use of laser beam irradiation, and a method for producing such a recording medium.

It is known that the phase-change type optical recording media by which recording and retrieving of information are made by a phase-change, that is, a change of atomic configuration such as observed between the crystalline and the amorphous state. In the ordinary phase-change optical recording media, a protective layer comprising a dielectric material is provided on the upper and/or lower side of the recording layer where recording and retrieving of information are made by a phase-change.

Generally, in the rewritable type phase-change recording media, at least two different laser beam power units are used for generating the different crystalline states. A recording medium of this system is here illustrated. Crystallization is proceeded by heating the recording layer to a temperature well between the crystallization temperature of this layer and approx. its melting point, while formation of the amorphous state is proceeded by heating the recording layer to a temperature above the melting point thereof and then rapidly cooling it. In this case, the said protective layer functions as a heat dissiperator for providing a desired cooling rate (super-cooling rate). The protective layer is also important for suppressing deformation which may be caused by a volumetric change concomitant to fusion or phase-change of the recording layer and a thermal expansion of the protective layer itself in the amorphous mark forming process, and for preventing thermal damage of the plastic substrate or deterioration of the recording layer due to humidity.

The material used for such a protective layer is selected by taking into consideration such requirements as being optically transparent to the laser beams irradiated, high in melting point, softening point and decomposition temperature, easy to form, and possessing an appropriate degree of heat conductivity. In the course of cyclic heating and rapid cooling in the overwriting operation, a temperature variation of over several hundred ° C. takes place instantaneously, in a fraction of less than 100 nsec, in the inside of the protective layer, with its side contacting the fused section of the recording layer being elevated in temperature while the side contacting the substrate or the reflective layer being left low in temperature. Consequently, there takes place an abrupt thermal expansion-induced deformation in the direction where it acts to force out the recording layer. The protective layer, therefore, is required to be able to withstand such an abrupt thermal expansion-induced deformation of this layer itself.

As stated above, dielectric materials such as oxides and nitrides of metals have been known as the protective layer materials which are chemically stable and have sufficient heat resistance and mechanical strength even in the high temperature region.

Generally, however, because of large difference in thermal expansion coefficient and elastic properties between the dielectric film and the plastic substrate, the dielectric film tends to separate from its substrate to cause formation of pin-holes or cracking as recording and erasing are repeated.

The oxides, nitrides, carbides and fluorides of silicon, tantalum, rare earth elements, etc., which are the typical amorphous dielectrics, are excellent in high temperature durability in the static high temperature condition, but they are high in hardness and fragile, so that when a sudden and local temperature change such as mentioned above takes place, a microscopic fault tends to grow into a crack to cause bursting. Also, since the plastic substrate is prone to warp due to moisture, the protective layer made of a dielectric material tends to create a stress at its interface with the substrate or the recording layer, resulting in causing layer fraction. Further, such a dielectric protective layer is poor in adhesion to the chalcogen elements which are usually used for the phase-change recording layer, so that it is more likely to separate when such elements are used.

On the other hand, in order to develop the unique properties unobtainable by use of a pure dielectric material, it has been suggested to use a composite dielectric comprising a mixture of a plural number of dielectric materials as the protective layer. As such composite dielectrics, there have been proposed various mixtures of the chalcogen element-containing compounds such as ZnS, ZnSe, PbS, CdS, etc., and the oxides, nitrides, fluorides, carbides, etc. Most notably, the use of a composite dielectric comprising a mixture of ZnS, which is the main component, with $SiO_2$, $Y_2O_3$ or the like has been proposed to provide a protective layer which enables over 1,000,000 times of repetitive overwriting in pit position modulation recording.

For instance, Japanese Patent Application Laid-Open (KOKAI) No. 5-174423 discloses a composite dielectric comprising ZnS and $Y_2O_3$. In an Example of this prior literature, there is a description that overwriting repeatability was improved by the use of both a protective layer comprising $Y_2O_3$ alone and another protective layer comprising $Y_2O_3$ substituted with ZnS by 80 mol % at most. The $ZnS/SiO_2$ composite dielectric has already been put to practical use as the material of the protective layers of phase-change recording media. Particularly the targets with a ZnS to $SiO_2$ molar ratio of 80 to 20 are widely used.

The protective layers comprising the said composite dielectrics excel those comprising purely oxide or nitride dielectrics in adhesion to the chalcogenide alloy (such as GeTeSb and AgInSbTe) films. These composite dielectric-made protective layers are also almost free of the problem of bursting resulting from generation and propagation of cracks typically seen when ZnS alone is used. Thus, by the use of these protective layers, the repetitive overwriting performance of the recording medium is improved, film separation in the accelerated test is minimized, and high overwriting reliability is obtained.

In recent years, however, request for better repetitive overwriting performance and durability of the recording has become strong. For instance, mark length modulation recording has been employed for attaining higher recording density, but when the mark length becomes shorter than about 0.5 $\mu$m, the repetition durability is remarkably reduced. This is because a slight increase of noise or a small change of reflectivity, which were overlooked in mark position recording, are not allowed in mark length modulation recording.

As a result of the present inventors' earnest study to solve the above problem, it has been found that In the $ZnS/SiO_2$ (typically 80/20 in molar ratio) composite films and the said $ZnS/Y_2O_3$ composite films, microscopic plastic deformations store up to cause an increase of noise or a reduction of reflectivity, and it is possible to inhibit or minimize the reduction of reflectivity and the increase of noise and to suppress the transfer of materials, by incorporating a protective layer of a specific composition such as containing an oxysulfide represented by $Y_2O_2S$.

The present invention has been attained on the basis of the above finding.

SUMMARY OF THE INVENTION

A first object of the present invention is to provide an optical recording medium capable of preventing the drop of reflectivity and the increase of noise while suppressing the transfer of materials in use, and having excellent repetitive overwriting performance.

A second object of the present invention is to provide a method for producing the recording medium mentioned in the first object.

To attain the above aim, a first aspect of the present invention, there is provided an optical recording medium having a protective layer and a phase-change recording layer on a substrate, said protective layer containing a metallic oxysulfide compound.

A second aspect of the present invention, there is provided an optical recording medium having a protective layer and a phase-change recording layer, said protective layer being formed by sputtering using a target comprising a metallic oxysulfide compound.

A third aspect of the present invention, there is provided an optical recording medium having a protective layer and a phase-change recording layer on a substrate, said protective layer containing yttrium, oxygen, sulfur or selenium and if necessary other component(s); and when the protective layer contains zinc, the number of atoms of zinc is a smaller than the total number of atoms of sulfur end selenium.

A fourth aspect of the present invention, there is provided an optical recording medium comprising a phase-change recording layer and protective layers provided on both sides of the phase-change recording layer, at least one of said protective layers being the protective layer as defined in the above first, second or third aspect.

A fifth aspect of the present invention, there is provided a method for producing an optical recording medium comprising forming a protective layer(s) on a substrate by sputtering with a target for forming protective layer, metallic oxysulfide compound being used as said target for forming protective layer.

A sixth aspect of the present invention, there is provided a sputtering target containing a metallic oxysulfide compound.

$Y_2O_3$, $Y_2S_3$, etc., are known as the components of the conventional protective layers. A mixed composition of $Y_2O_3$ and ZnS is also known. However, the protective layers of these compositions are incapable of providing the said excellent properties, especially repetitive overwriting performance, but the use of metallic oxysulfides compound such as $Y_2O_2S$ as the sputtering target makes it possible to obtain the desired properties. The protective layer obtained by sputtering a metallic oxysulfide compound according to the present invention is completely deferent from that of the known protective layer compositions in the minute structure which varies greatly depending on the use of a metallic oxysulfide compound as the sputtering target material.

BRIEF DESCRIPTION OF THE DRAWINGS

FIG. 5 is a graph showing the evaluation results (signal modulation) of Examples 5 and 6 and Comparative Example 2.

DETAILED DESCRIPTION OF THE INVENTION

The present invention is described in detail below.

Figure 1:
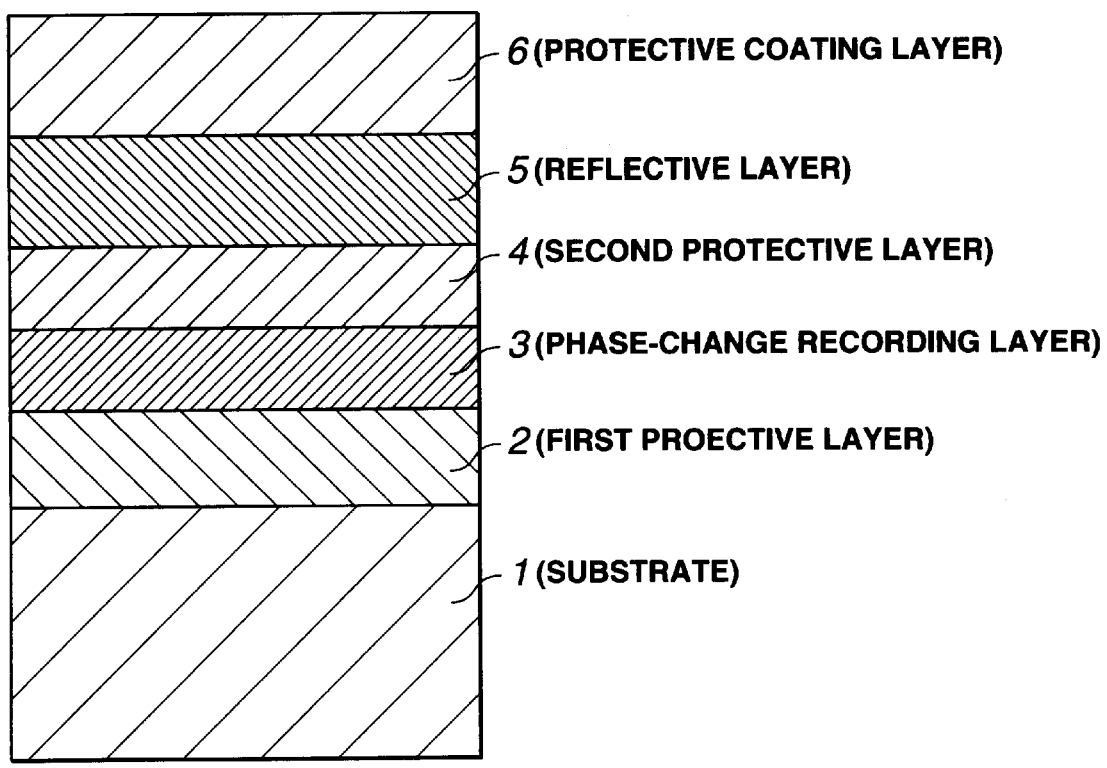
FIG. 1 is a schematic sectional view showing an example of layer structure of the optical recording medium according to the present invention.
Figure 2:
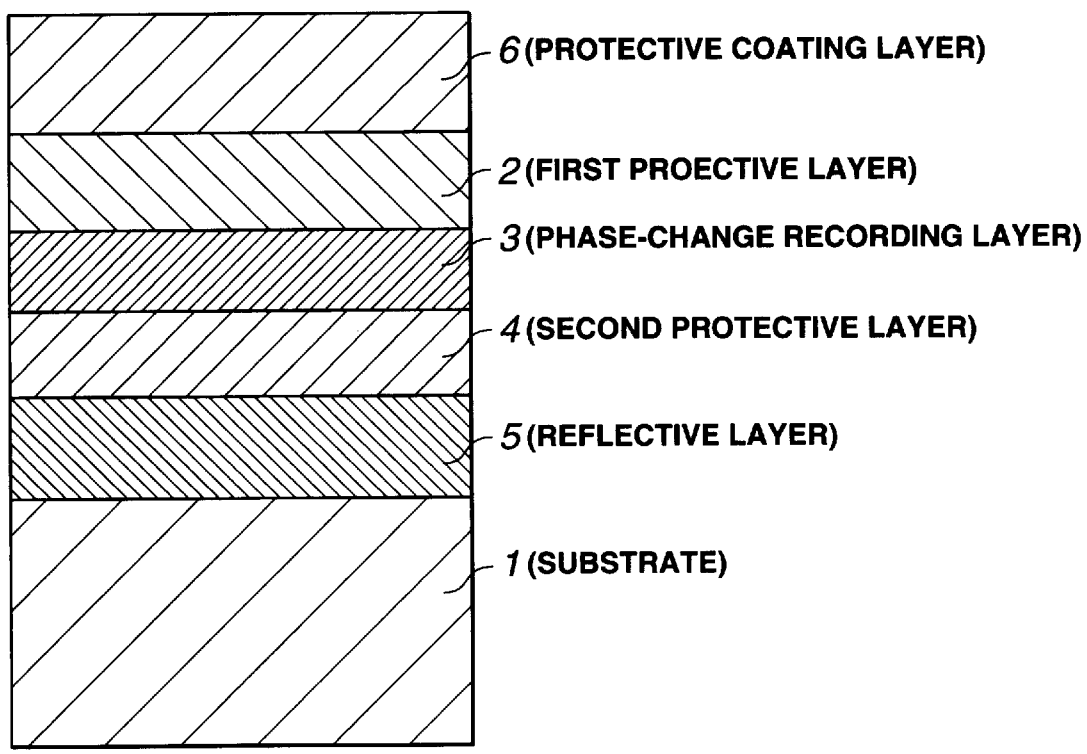
FIG. 2 is a schematic sectional view showing another example of layer structure of the optical recording medium according to the present invention.

First, the general construction of the optical recording medium according to the present invention is illustrated. FIG. 1 is a schematic sectional view showing an example of the multilayer structure of the recording medium according to the present invention, and FIG. 2 is a schematic sectional view showing another example of the multilayer structure of the recording medium of the present invention. The recording medium shown in FIGS. 1 and 2 comprises a substrate (1), a first protective layer (2), a phase-change recording layer (3), a second protective layer (4), a reflective layer (5) and a protective coating layer (6) in this order. The recording medium shown in FIG. 2 comprises a substrate (1), a reflective layer (5), a second protective layer (4), a phase-change recording layer (3), a first protective layer (2) and a protective coating layer (6) in this order. In the present invention, the protective layer on the opposite side of the reflective layer as viewed from the recording layer is called the first protective layer, and the protective layer on the reflective layer side as viewed from the recording layer is called the second protective layer.

Transparent resins such as polycarbonates, acrylics, polyolefins, photosetting resins, etc., and glass are ordinarily used as the substrate (1) material. Transparent resins are preferable in terms of productivity. Polycarbonate resins are particularly preferable because of excellent water absorption properties, optical properties and adhesion to the protective layer.

The phase-change recording layer (3), protective layers (2) and (4) and reflective layer (5) are usually formed by sputtering or vacuum deposition. Conducting the layer formation in an in-line system having a target for the recording layer, targets for the protective layers and a target for the reflective layer all set in a same vacuum chamber is advantageous for preventing oxidation and contamination between the layers. In this case, it is possible either to carry out co-sputtering by using plural targets or to use a composite target for forming the respective layers. Usually a high-hardness UV-curing or heat-curing resin is used as the material of the protective coating layer (6).

Thickness of the recording layer is usually 1 to 100 nm, preferably 5 to 50 nm. When the recording layer thickness is too small, it may be difficult to obtain a desired contrast. Also, in this cases the crystallization speed tends to lower, making it hardly possible to erase recording in a short time. When the recording layer thickness is too large, it may be also hardly possible to obtain a desired optical contrast, and cracking tends to occur. A thickness of 5 to 30 nm is particularly preferable for obtaining a contrast (for example, a contrast with a modulation factor of not less than 50%) capable of providing interchangeability with CD like the lately developed rewritable type compact discs (CD-RW), and for obtaining a contrast capable of providing interchangeability with rewrite type DVD which is expected to appear on the market in the future. A too small thickness of the recording layer will also reduce reflectivity to excess, while a too large thickness will increase the heat capacity, which tends to deteriorate recording sensitivity.

As the recording layer material, various materials capable of occurrence of the phase-change (for example, crystalline-amorphous states change) accompanied with the change of various optical properties such as reflectance, can be used, and alloys are usually used. As the alloys, alloys containing chalcogen element such as GeSbTe, InSbTe, AgSbTe and AgInSbTe are preferably used. These are the materials suited for overwriting. More specific examples of such alloys include $\{(Sb_2Te_3)_{1-X}(GeTe)_X\}_{1-Y}Sb_Y$ alloys ($0.2 \leq X \leq 0.9$, $0 \leq Y \leq 0.1$), and the alloys having an additive element or elements (at least one of In, Ga, Zn, Sn, Si, Cu, Au, Ag, Pd, Pt, Bi, Pb, Cr, Co, O, N, S, Se, Ta, Nb, V, W and rare earth metal elements) contained in the said ternary alloys in an amount of up to about 10 mol %. If the composition on the pseudo-binary alloy of $Sb_2Te_3$ and GeTe is brought close to a $Ge_2Sb_2Te_5$ intermetallic compound composition, overwriting becomes possible even at a linear velocity of not lower than 10 m/s.

The MSbTe alloys (M representing at least one of In, Ga, Zn, Ge, Sn, Si, Cu, Au, Ag, Pd, Pt, Bi, Pb, Cr, Co, O, N, Se, Ta, Nb, V, W and rare earth metal elements) mainly comprising SbTe close to the eutectic point of Sb(70)Te(30) are also a preferable material enabling high-speed overwriting.

Those of the above alloys which have the composition of $M_W(Sb_ZTe_{1-Z})_{1-W}$ ($0 \leq W \leq 0.20$, $0.6 \leq Z \leq 0.9$) are more preferable. With the alloys of this composition, good overwriting is possible in a wide range of linear velocity, from 1.2 to 30 m/s (1 to 24 times the linear velocity of CD, where the ratio of the maximum to the minimum linear velocity is not less than 2.

In the case of the films of the alloys close to the eutectic point of Sb(70)Te(30), the linear velocity dependency is decided by the Sb/Te ratio since there is the tendency that the higher the Sb/Te ratio is, the higher becomes the crystallization speed.

The recording layer being formed is usually amorphous, and its whole surface is crystallized and brought into an initialized state (non-recorded state) before applied to use. Initialization can be accomplished by heating the recording layer instantaneously to a temperature above the crystallization temperature by flashlamp annealing or by laser means condensed to around 100 μm. Melt-quenching initialization is preferred as one method for shortening the time required for initialization and completing initialization by one irradiation with initializing light beams.

For example, melting is effected by confining it to the central portion of the beams by locally heating with light beams converged to a diameter of approximately 10 to several hundred μm (gas laser or semiconductor laser beams) or light beams condensed to an oval shape with a longer axis of about 50 to 100 μm and a shorter axis of about 1 to 10 μm. In this operation, since the peripheral portion of the beam is heated simultaneously, the molten area is quenched and re-solidified at lower the cooling rate, allowing the recrystallization to take place in a desirable way. This can curtail the initialization time to ¹⁄₁₀ of that required in conventional solid-phase crystallization, thus greatly enhancing productivity and allowing prevention of change of crystallinity in the erasing operation after overwriting.

The first and the second protective layers are provided for preventing deformation of the substrate and the recording layer due to high temperature in the recording operation. A specific film explained later is used for at least one of the said protective layers. In case this film is used for one protective layer alone, the material of the other protective layer can be selected from the following viewpoints.

Generally, the material used for the dielectric protective layers is chosen by taking into account such matters as refractive index, heat conductivity, chemical stability, mechanical strength and adhesion, but ordinarily oxides, sulfides, nitrides and carbides of metals and semiconductors with high transparency and high melting point, as well as fluorides of Ca, Mg, Li and like elements are used. Also, since the recording layer is repeatedly heated to several hundred up to around 1,000° C. during overwriting, the said material is required to have a melting point or decomposition point of not lower than 1,000° C. Further, it needs to be substantially transparent to the laser beams of the wavelength used for retrieving of the recorded information. The wavelength used for this operation is usually 600 to 800 nm, but it is expected to be shortened to around 400 nm in the near future.

It is of course not required that the material be transparent to the whole range of wavelength, from 400 to 800 nm, supposed to be used for the operation; it is only required to be transparent to the laser beams of the actually used wavelength. "Being substantially transparent" means that the absorption factor which is the imaginary portion of the complex refractive index to the wavelength is less than 0.2. The materials usable for the dielectric protective layers include various types of dielectric materials such as oxides, nitrides, sulfides, carbides and fluorides of metals and semiconductors, and their mixtures and composites. The more concrete examples of such compounds include zinc sulfide, zinc oxide, silicon oxide, silicon nitride, aluminum nitride, rare earth oxides, rare earth sulfides, rare earth fluorides, magnesium fluoride and the like. A mixture of zinc sulfide and silicon oxide is especially preferable.

For the reflective layer, a material with high heat dissipating potency and high heat conductivity such as Au, Ag, Al and their alloys can be preferably used. The reflective layer thickness is usually not more than 1,000 nm for the economical reason. It is preferably 0.01 to 100 nm.

Next, the essential features of the optical recording a medium according to the present invention are described.

In the first aspect of the present invention, the said protective layers contain a metallic oxysulfide compound. By the expression "containing a metallic oxysulfide" is meant that this component element is present maintaining the form of a metallic oxysulfide. Examples of the metallic elements usable for the metallic oxysulfides include lanthanoid elements such as La and Ce, rare earth metal elements such as yttrium, and transition metal elements such as Sc and Ti. The rare earth metal elements are preferable, of which yttrium and those selected from the group consisting of La, Ce, Nd, Sm, Eu, Gd, Tb and Dy are more preferable. Yttrium is especially preferable because oxysulfides of yttrium are more thermally stable at the high temperature up to approx. 1000° C. than $Y_2O_3$ and $Y_2S_3$. The content of the metallic oxysulfide in the protective layer is usually not less than 5 mol %, preferably not less than 10 mol %, more preferably not less than 15 mol %. The content of metal element constituting metallic oxysulfides in the protective layer is usually not less than 10 mol %, preferably not less than 20 mol %, more preferably rot less than 25 mol %.

If its content is to small, the produced recording medium may be unsatisfactory in its overwriting performance. The protective layer containing a metallic oxysulfide such as mentioned above can be formed by sputtering using a target containing a metallic oxysulfide. The sputtering method used here will be described later.

The protective layer may contain a mixture of a metallic oxysulfide and other dielectric materials. As the dielectric material to be mixed, there can be employed various types of dielectrics generally used for the protective layer such as mentioned above, which include oxides, sulfides, nitrides, carbides and fluorides of metals and semiconductors, more specifically, zinc sulfide, zinc oxide, silicon oxide, silicon nitride, aluminum nitride, aluminum oxide, rare earth oxides, rare earth sulfides, rare earth fluorides, magnesium fluoride and the like. Of these materials, the zinc compounds such as zinc sulfide and zinc oxide are especially preferable because of excellent adhesion to the recording layer. Incorporation of these dielectric materials contributes to the improvement of stability and durability of the product. The content of the zinc compound in the protective layer is usually not more than 99 mol %, preferably not more than 90 mol %. However, the optimal content varies depending on the type of the zinc compound used. For example, in the case of zinc sulfide, there is no problem when large amount thereof is contained, but its content is usually not less than 20 mol %, preferably not less than 30 mol %, more preferably not less than 50 mol %, most preferably not less than 60 mol %. In the case of zinc oxide, on the other hand, a too much content may be undesirable, and its content should be usually not more than 30 mol %, preferably not more than 20 mol %, more preferably not more than 10 mol %. Further, the mol content of zinc oxide is preferably not more than the half mol content of metallic oxysulfide In the first aspect of the present invention, an outstandingly excellent overwriting performance can be realized by using a mixed composition containing $Y_2O_2S$ and ZnS, which is an especially preferable protective layer composition. In this case, the molar ratio of ZnS to $Y_2O_2S$ is usually not less than 1%, preferably not less than 5%, more preferably not less than 10%, and is usually not more than 1,000%, preferably not more than 700%, more preferably not more than 500%.

Zinc may be allowed to exist in a metallic form in the protective layer, but it is more preferable to have it contained in the form a zinc compound like zinc oxide or zinc sulfide mentioned above. The mechanism which elucidates the relationship between the zinc content and the film properties and durability is yet to be clarified.

The second aspect of the present invention is now described.

In the second aspect of the invention, which is substantially of the same construction as the first embodiment described above, the specific protective layer contains yttrium, oxygen, sulfur or selenium and if necessary other component(s). When zinc is contained as an optional component, the number of atoms zinc should be smaller than the total number of atoms of sulfur and selenium. That is, in the second aspect, there is provided the protective layer which (1) contains yttrium, oxygen and sulfur or selenium, and (2) may also contain zinc of a smaller number of atoms than the total number of atoms of sulfur and selenium (zinc may not be contained at all).

The ratio of the number of yttrium atoms to the total number of atoms of yttrium (Y), oxygen (O), sulfur (S) or selenium (Se) and zinc (Zn) in the protective layer is usually 25 to 50%, preferably 30 to 50%, more preferably 35 to 45%. When the said ratio is too small, the relative overwriting performance tends to reduce, and when the ratio is to large, the contents of oxygen and sulfur or selenium lower correspondingly to constitute substantially a mixture of dielectrics and metals, which tends to form an optically opaque film.

The atomic concentration of oxygen atoms to the total number of atoms of yttrium (Y), oxygen (O), sulfur (S) or selenium (Se) and zinc (Zn) in the protective layer is usually 30 to 50%, preferably 35 to 45%. When the said concentration is too small, the optical absorption coefficient of the film increases, which tends to lower the laser power sensitivity, and when the ratio is too high, the content of sulfur or selenium may drop correspondingly, resulting in reduction of adhesion force to the recording layer.

Sulfur or selenium in the protective layer has strong bond to the elements, especially chalcogenide elements in the recording layer to secure adhesion between the recording layer and the protective layer. It should be noted, however, that if the sulfur or selenium atoms are in a free state, there may take place diffusion of these atoms from the protective layer to the recording layer to encourage segregation deterioration, so that the atomic concentration of sulfur or selenium atoms to the total number of atoms of yttrium (Y), oxygen (O), sulfur (S) or selenium (Se) and zinc (Zn) in the protective layer is usually 5 to 40%, preferably 10 to 30%, more preferably 15 to 25%. When the said ratio is too small, adhesion to the recording layer lowers, and separation tends to take place during initialization or repetitive overwriting, while when the ratio is too large, part of the sulfur or selenium atoms tend to be liberated. Namely, the protective layer preferably contains sulfur. In addition to containing sulfur atoms, selenium atoms may be contained in the protective layer for controlling the properties such as reflectance and hardness. In this case, the amount of the selenium atoms contained is preferably not more than 50% based on the total of sulfur atoms and selenium atoms. This concentration ratio of Se and S is controlled for fine tuning of hardness or reflective index etc. The sulfur atoms and selenium atoms contained in the protective layer are preferably present as compound state such as oxysulfide and zinc sulfide. If the sulfur atoms and selenium atoms are present at atomic state, the crystallization speed and optical constants may be changed because these atoms are diffused into the recording layer by repetitive overwriting.

The protective layer may contain zinc. It is to be noted, however, that when the atomic concentration of zinc atoms is more than that of the sulfur atoms in the protective layer, the properties such as cycle performance of the medium are adversely affected. The atomic concentration of zinc atoms in the protective layer is usually 0 to 20%, preferably 0 to 10%. When the said concentration is too high, durability tends to be impaired. It is one of the key factors for obtaining a durable film that the number of zinc atoms is smaller than the number of sulfur or selenium atoms. That is, the ratio of the number of zinc atoms (Zn) to the total number of sulfur and selenium atoms (S+Se), viz. Zn/(S+Se), is preferably not more than 0.97, more preferably not more than 0.95, even more preferably not more than 0.90, still more preferably not more than 0.80, further more preferably not more than 0.50. Under the above condition, zinc atoms are usually present as the state of zinc sulfide and selenium sulfide and there is little possibility that the zinc atoms are present as metal state. Further, it is considered that even though the sulfur atoms and selenium atoms are released, these can be trapped as zinc sulfide and selenium sulfide.

In the second aspect of the present invention, the protective layer preferably contains $Y_2O_2S$. "Containing $Y_2O_2S$" signifies that yttrium, sulfur and oxygen exist while maintaining the compound form of $Y_2O_2S$. The structural makeup of the embodiment containing $Y_2O_2S$ is substantially the same as that of the first aspect. In the second aspect, the protective layer may contain a mixture of $Y_2O_2S$ and other dielectric material such as zinc sulfide or zinc oxide. Especially, when zinc oxide is contained in an amount of 1 to 30 mol %, it is considered that even though sulfur atoms are released slightly from $Y_2O_2S$, the released sulfur atoms can be trapped according to the following reaction formula and the properties is in stable.

$$Y_2O_2S + ZnO \rightarrow Y_2O_3 + ZnS$$

The mechanism of preventing deterioration in overwriting by virtue of the protective layer in the present invention is unclear, but it is considered to have relation with high heat conductivity and hardness and uniform distribution of the component elements. That is, the protective layer in the present invention is characteristically higher in heat conductivity and hardness than the composite dielectric films mainly comprising ZnS (the ZnS content being not less than 60 mol %), such as ZnS—SiO$_2$ film, which have been commonly used in the art. On the other hand, the refractive index is substantially equal to that in the art and variable by the composition but usually 1.7 to 2.2.

It is considered that by a higher heat conductivity, a deformation due to thermal expansion is small. That is, by releasing as quickly as possible heat of the recording layer heated during formation of a recording mark by laser irradiation, it is possible to rapidly eliminate tic temperature discrepancy between the interfacial area of the protective layer in contact with the recording layer and the area remote from the recording layer, or the temperature discrepancy between the mark-formed area and its surrounding. Consequently, it becomes possible to suppress the film separation or cracking can occur due to temperature discrepancy, that is, it is possible to suppress deterioration of overwriting. Heat conductivity can be known indirectly from the value of laser power when an amorphous mark is formed in the produced disc. That is, generally, the higher the heat conductivity, the larger is the laser power required for heating the recording layer. At least relative comparison of head conductivity with the ZnS-based protective layer is possible, and the power necessary for mark formation when the protective layer in the present invention was used is higher than conventional ZnS(80)SiO$_2$(20) film.

JIS Knoop hardness Of Y$_2$O$_2$S in the protective layer of the present invention is 520 as compared with 280 of the conventional ZnS(80)SiO$_2$(20) (in molar ratio) composite film. Such high hardness of the protective layer in the present invention is important matter for preventing deformation of the recording layer. When the protective layer hardness is low, it is hardly possible to properly suppress the volumetric change of the recording layer incidental to recording and erasion, viz. deformation resulting from volumetric difference between the amorphous and the crystalline state, and such deformation accumulates as overwriting is conducted repeatedly, resulting in a reduction of signal strength.

The protective layer in the present invention preferably has a purity of not less than 90 mol %. The higher the purity, the more preferable, but the influence of less than 10 mol % impurities to the properties of the protective layer is negligibly small. Especially, if the impurities is stable compound, the influence is more small. However, when the amount of the impurities exceeds 10 mol % are liable to cause a change of properties such as hardness and stress of the layer.

The protective layer with high heat conductivity according to the present invention is also useful for the media having a recording layer of multilayer construction (have not been realized as practical use yet). That is, in the case of a medium having a dual recording layer, for forming an amorphous mark in the recording layer on the light incident side, the metallic layer which does not transmit light can not be utilized as a heat dissipation layer in recording. In contrast, in the case of the protective layer according to the present invention, since the said layer has very high heat conductivity even though not necessarily equal to that of metals, it is possible to obtain a sufficient high cooling rate in amorphous mark formation.

The protecting layer in the medium according to the present invention is usually provided in contact with the phase-change recording layer, either on its substrate side or on the opposite side. In the case of an ordinary phase-change optical recording medium, the protective layer is provided on both sides of the recording layer. In this case, the above-described protective layer may be provided either on one side alone or on both sides of the recording layer.

In case where the above-described protective layer is used as the first (or second) protective layer, it is possible to provide a first (or second) dielectric protective layer of a different composition. That is, in the medium of the present invention, on the protective layer of the said specific composition, there can be added another protective layer of a different composition. In this case, the first (or second) dielectric protective layer is of a multilayer structure.

In case where the dielectric protective layer is of a multilayer structure, various types of dielectric materials such as oxides, nitrides, sulfides, carbides and fluorides of metals and semiconductors, as well as their mixtures and composites can be used as the material of the protective layer different from that of the present invention in the multilayer structure. More concretely, these compounds include zinc sulfide, zinc oxide, silicon oxide, silicon nitride, aluminum nitride, rare earth oxides, rare earth sulfides, rare earth fluorides and magnesium fluoride. Mixtures of zinc sulfide and oxide of metal or semiconductor is more preferable. Since these mixtures are usually relatively low in heat conductivity, the designability of protective layer can be increased in case of combining the protective layer having the above specific composition. In this case, zinc sulfide is preferably contained in an amount of not less than 50 mol %, more preferably not less than 60 mol %. A mixture of zinc sulfide and silicon oxide is especially preferable.

When a multilayer structure is formed by combining the protective layer of the present invention with the other protective layer as explained above, it is suggested to use a material with lower heat conductivity than the protective layer of the present invention (for example a mixture of zinc sulfide and silicon oxide) for the other protective layer, because the use of such a material conduces to the improvement of recording sensitivity and adhesion between the protective layer of the present invention and the other protective layer to better age-based stability of the multilayer structure. Thus, since the protective layer of the specific composition of the present invention has high heat conductivity, it becomes possible to properly control heat conductivity by combining thereon the other protective layer with lower heat conductivity. This makes it possible to comply with the requirements for proper recording sensitivity, heat dissipation and cycle performance at the sane time.

In the said multilayer structure, the protective layer of the present invention may be provided either in contact with or separate from the recording layer, but it preferably provided in contact with the recording layer for maximizing the effect of the present invention. In this case, the thickness of the protective layer of the present invention is usually 0.1 to 250 nm, preferably 5 to 25 nm more preferably 1 to 10 nm.

The thickness profile of the first or second dielectric protective layer in FIG. 1 and FIG. 2 is as follows. The thickness of the first protective layer is usually 10 to 250 nm. If the said thickness is too small, the layer may be unable to prevent the substrate or protective coating layer from being deformed by heat in recording. When the said thickness is too large, the film tends to crack and also an unrealistically long time is required for film forming. The thickness of the second protective layer is usually 0.1 to 100 nm, preferably 1 to 50 nm, more preferably 5 to 50 nm, especially preferably 10 to 50 nm.

It is preferable to use, as the first protective layer, a film containing a chalcogen compound and SiO$_2$ and, as the second protective layer, a film specified in the present invention (protective layer of the present invention) which is smaller in thickness than the first protective layer. For, this layer specification can assure high productivity as the specified film is generally lower in film forming rate than the film made of a chalcogen compound and SiO$_2$.

The said protective layer of the present invention is usually formed by sputtering.

The protective layer composition is greatly dependent on the formulation of the target used for sputtering, so that in the present invention the selection of the target is important for much in forming the protective layer by sputtering. Concretely, it is important to use a target having a composition which is substantially close to that of the protective layer.

In the first aspect of the present invention, a target containing a metallic oxysulfide is used for sputtering. In the target containing a metallic oxysulfide, since the metallic atoms are combined with both sulfur and oxygen atoms, miscibility of sulfur and oxygen is incomparably higher than the mixtures of sulfides and oxides such as $ZnS/SiO_2$ mixture. Therefore, the protective film formed by using such a target has a stabilized high performance owing to higher sulfur and selenium atom dispersibility than the conventional $ZnS$—$SiO_2$ composition. The metallic elements of the metallic oxysulfide used for the target are properly selected in conformity to the protective layer composition. As such metallic elements, there can be used, for example, lanthanoid elements such as La and Ce, rare earth metal elements such as yttrium, and transition metal elements such as Sc and Ti. The rare earth metal elements, especially yttrium and those selected from the group consisting of La, Ce, Nd, Sm, Eu, Gd, Tb and Dy are preferable. Yttrium is especially preferable.

In case where the protective layer contains a metallic oxysulfide and other dielectric material, it is possible to use a target comprising a mixture of a metallic oxysulfide and the said other dielectric material in correspondence to the composition of the other dielectric material used. It is also possible to separately prepare a target of a metallic oxysulfide and a target of the said other dielectric material and sputter them simultaneously.

The conventional targets used for forming the composite (like $ZnS$—$SiO_2$) dielectric films usually comprise mixtures of the compound powders having a particle size of several microns, and it is considered that the sputtered film, though higher in mixing uniformity than the targets, still has the local non-uniform portions when viewed from the atomic or molecular perspective. It is deemed that in such non-uniform portions, the property values such as hardness may shift delicately from the normal ones to cause a difference in durability of the film. Also, even if the target materials are dispersed so finely that their crystallinity can not be confirmed by X-ray diffraction, there do exist the grain boundaries, and cracks may develop from such grain boundaries.

In the second aspect of the present invention, a target containing (1) yttrium, oxygen and sulfur or selenium and (2) if necessary zinc of a smaller number of atoms than the total number of atoms of sulfur and selenium is used as the target for the protective layer.

As the materials of such a protective layer target, there can be used various types of materials which can provide the said composition. For example, it is possible to use $Y_2O_2S$, $YS_x$, $YSe_x$, $YO_x$, ZnO, ZnS, etc., and their mixtures in suitable combinations. Such targets may be used either singly or in combination; for instance, it is possible to use the targets made of the single compounds or one composite dielectric target. More stabilized control of composition is made possible by using the single-compound targets or one composite dielectric target.

In this case, the protective layer target used for sputtering preferably principally comprises $Y_2O_2S$ or $Y_2O_2Se$, preferably $Y_2O_2S$. It is possible to substitute the partial sulfur atoms of $Y_2O_2S$ with selenium atoms, however, the substituting amount of the sulfur atom with selenium atoms is preferably 50%. In such a target, the yttrium atoms which are combined with the sulfur or selenium atoms are also combined with the oxygen atoms, so that miscibility of sulfur or selenium atoms and oxygen atoms is incomparably higher than the sulfide/oxide (such as $ZnS/SiO_2$) mixtures. Consequently, it is considered that the protective film formed by using such a target exhibits the stabilized high-degree properties owing to higher dispersibility of sulfur or selenium atoms than the conventional $ZnS$—$SiO_2$ target.

The target producing conditions are an important factor in deciding the state of the film formed by sputtering. A composite dielectric target can be manufactured, for example, by the following method using a press comprising a carbon-made punch and a die coated with boron nitride for preventing the target from adhering to the die surface. That is, a weighed predetermined amount of powder is placed in a die and sintered by hot press. In this operation, until the temperature reaches 600 to 800° C., sintering is conducted in vacuo for removing the impurities deposited on the carbon, and at the temperatures used thereafter, the inside atmosphere of the die is replaced with argon gas to uniformalize the temperature in the system and increase the sintering efficiency. The sintering temperature is set below the melting point of the powder, but it is selected so that a target with as high a density as possible can be produced. Target density affects the sputtering rate. A high-density target is preferred for obtaining a high sputtering rate.

In the first and second aspects of the invention, as the powder material of the target, there can be used, for example, a mixture of a metallic sulfide and a metallic oxide. In this case, the metallic sulfide and the metallic oxide undergo a solid-phase reaction under the sintering heat to form a metallic oxysulfide. Thus, no matter whether the starting material is a single compound (a rare earth oxysulfide) or a mixture such as mentioned above, there can be obtained a same target by sintering in hot press. Therefore, the method using a mixture is economically advantageous as it requires no separate synthesizing operation for the metallic oxysulfide, and is capable of producing a target with high sintering density. In case of using yttrium as the metal, since a target having high density of not less than 90% can be easily formed, it is preferable to sinter a mixture of $Y_2O_3$ and $Y_2S_3$ in a mixing molar ratio of 2:1. The formation of $Y_2O_2S$ in the target can be confirmed by X-ray diffraction. In case where zinc is contained in the protective layer, it is preferably used as a powder in the form of zinc oxide or zinc sulfide.

In case where a mixture of a metallic oxysulfide such as $Y_2O_2S$ and zinc oxide is used as starting powder for the target, zinc sulfide and zinc oxide may be formed by the heat of sintering. For example, a target comprising a mixture of $Y_2O_2S$, zinc sulfide and yttrium oxide can be produced by sintering a mixture of $Y_2O_2S$ and zinc oxide. This method is preferable because sulfur atoms which are tend to release as $SO_x$ gas formed by reacting with oxygen molecule or oxygen atom in the sintering at the high temperature, can be stably trapped as ZnS in the solid phase. The amount of zinc oxide in the target is usually 30 mol % because excess proceeding of such reaction of trapping may be not preferable.

The target manufactured in the manner described above is usually ground and pre-sputtered before offered to sputtering. The film composition varies greatly depending on the sputtering conditions even when a same target is used, so that proper selection of the sputtering conditions is essential, but usually the following conditions are used. As the gas, usually an inert gas such as Ne, Ar, Kr or Xe is used. Of these gases, Ar is preferably used for the economical reasons. The pressure applied is usually not more than 1 Pa. As far as discharge of electricity can be conducted in a stabilized way, sputtering is preferably carried out under as low a pressure as possible as a high film density can be obtained thereby. Ordinarily, it is satisfactory to use an RF sputtering frequency of not lower than 10 MHz. The distance between the target and the substrate is preferably as short as possible for minimizing the loss in the film forming operation to elevate the sputtering efficiency while eliminating non-uniformity of the formed film thickness distribution. Such distance is ordinarily not more than 30 cm, preferably not more than 20 cm, and practically not less than 0.1 cm.

During sputtering, it is possible to let the substrate or the target turn on its own axis (turn about its centroid) or revolve round a different axis (the centroid moves along the circumference of a prescribed circle). The speed of revolution is ordinarily around 1 to 500 rpm. In case where the substrate or the target is revolved, sputtering proceeds with the substrate-target distance varying, but even in this case, its maximum distance is preferably not more than 30 cm, especially not more than 20 cm, and the minimum distance not less than 0.1 cm.

When a sputter film is formed with a target containing residual ZnO which has not been converted to ZnS in the sintering, it is considered that most of the Zn atoms in the film exist in the stable form of ZnO. There is a possibility that part of the zinc atoms be combined with sulfur or selenium to form additional ZnS or ZnSe in the formation of film, but it is considered that such zinc atoms account for only a few percent of the whole zinc atoms. This may be regarded as an impurity which gives no influence to the film properties.

In the case of a phase-change optical recording medium, ordinarily the amorphous portion serves for recording (mark) and the crystal portion works for erasion and non-recording operations. When the linear velocity of the recording light beam (scanning speed of the recording layer relative to the recording light beam) increases, the locally heated portion produced by light irradiation in the recording operation necessarily becomes more liable to cool within shorter time, so that, in this case, re-crystallization becomes less liable to occur, that is, erasing becomes harder to effectuate. So, in order to apply to high linear velocity recording, usually a material and a thickness which facilitate crystallization are selected for the construction of the recording layer. When such high-speed recording oriented medium is used at lower speed, re-crystallizaiton is so predominant that amorphous mark formation is rather disturbed. Such operation is the case when the medium is applied for constant angular velocity (CAV) mode, where the ratio of minimum and maximum recording liner velocity can reach even over 2. In the case of the recording medium of the present invention, on the other hand, since a material with high heat conductivity is used for the protective layer, the cooling rate is high even if the recording layer is heated by light irradiation at lower side velocity. Therefore, when the said protective layer is used for the medium designed to accommodate high linear velocity recording, especially CAV recording using a material for recording layer which is easily crystallized, formation of the amorphous mark which has been made less easier to form by the crystallizing tendency is facilitated by the high heat dissipating speed. Thus, the medium of the present invention becomes more effective when it is used for recording at higher linear velocity and CAV recording. It is especially effective when recording is performed at a linear velocity of usually not less than 3 m/s, preferably not less than 5 m/s, more preferably not less than 10 m/s. However, recording at a too high linear velocity presents difficulties in designing of the medium, so that ordinarily the linear velocity for recording is not more than 50 m/s.

The recording medium of the present invention produces a particularly high effect for mark length modulation recording, especially recording with the minimum mark length of not more than 1.0 μm, or possibly not more than 0.5 μm, so that the present medium is preferably used for such mode of recording.

The protective layer in the present invention has high heat conductivity and the optical recording medium of the present invention having such a protective layer or layers shows very high repetitive overwriting performance and data storing stability and is credited with high reliability. Also, the optical recording medium of the present invention excels in adhesion and archival stability. Further, according to the method of the present invention, it is possible to produce such a recording medium with stability at high productivity.

EXAMPLES

The present invention will be described in further detail with reference to the examples thereof. It should be understood, however, that these examples are merely intended to be illustrative and not to be construed as limiting the scope of the invention. In the following Examples, the atomic compositional ratios were determined by XPS (X-ray photoelectron spectroscopy) as follows.

The XPS measurements were conducted by using an ESCA-5500MC type X-ray photoelectron spectroscopy manufactured by PHAI CO., LTD. As X-ray source, Al-Kα (14 KV, 150W) using a monochrometer was used. Measurement area of the specimen was 0.8 mmφ. The specimen was tilted to 60° and scattered photoelectron was detected. In order to prevent charging, an electron beam was irradiated to the surface of specimen. Further, in order to remove the contamination on the surface of specimen, etching thereto was conducted by irradiating an Ar beam (3 keV and 25 mA) for 1 minute. By conducting the etching operation, the sulfur content was slightly reduced. Therefore, in Examples supporting the second aspect, the etching operation was conducted by such a manner that even though the reduction of sulfur content, the sulfur content became larger than zinc content. The quantitative determination of each yttrium, oxygen, sulfur and zinc was calculated by using $Y_{3p}$, $S_{2s}$, $Zn_{2p}$, $O_{1s}$ and $Si_{2p}$ peaks in the XPS measurement. The composition ratio was calculated by dividing the peak area with a correction factor, that is, peak area/correction factor as follows.

Composition of atom (atomic %)={(peak area of the element)/(correction factor)}/Σ{(peak area of the element)/(correction factor)}

The sum was taken for Y, S, Zn and O (and Si if included). The correction factors to the peak of $Y_{3p}$, $S_{2s}$, $Zn_{2p}$, $O_{1s}$ and $Si_{2p}$ were 1.621, 0.399, 3.354, 0.711 and 0.283, respectively. Generally, by the sputtering, Y and O were joined in the film with the same ratio. On the other hand, the ratios of S and Zn joined tend to reduce about 10–20% and one-few comparing with the ratio of S and Zn in the target, respectively.

The wording of "recording power" used in the following Examples is distinguished with "Pw" which is a practically used recording power and "$Pw_e$" which is an effective recording power calculated from converting reflectance. Concretely, the effective recording power $Pw_e$ is calculated from the following formula:

$$PW_e = Pw \times (100-R_1)/100$$

where $R_1$ (%) is the reflectance of the medium to the recording-retrieving laser beam thereto in Examples.

The reason for using the effective recording power $Pw_e$ is set forth below. Since the reflectance is deferent in each medium even though having the same layer constitution by fine deference between reflectances of the protective layers in each Example (1.9 to 2.1), substantial absorbing light energy into the recording layer is different in each medium. "100−$R_1$" is primary considered as the absorbed energy ratio into the recording layer. Therefore, it is required to correct the recording power value by using the above formula. By comparing each effective recording power Pw$_e$, the effect of heat loss from the recording layer can be probably evaluated by the difference of heat conductivity between each protective layer. Namely, it is considered that the higher effective recording power Pw$_e$ is, the higher heat dissipating potency is, that is, the higher heat conductivity is.

Example 1

A powder mainly comprising Y$_2$O$_2$S having an average particle size of approximately 8 μm (Y$_2$O$_2$S: 94.3 wt %; Eu$_2$O$_2$S: 5.6 wt %; Sm$_2$O$_2$S: 0.1 wt %) was hot pressed at 1,325° C. under a pressure of 20 tons for 2 hours and thereby sintered. The sintered product was ground well and then In-soldered to a Cu plate to make a target for forming the first and second protective layers. The density of the target was approx. 75% of the theoretical density On a 1.2 mm thick polycarbonate substrate were laminated the layers in the order of first protective layer, recording layer, second protective layer and reflective layer by sputtering in the manner described below to manufacture a phase-change optical disc. The layer thickness profile was as follows: first protective layer=160 nm, recording layer=30 nm, second protective layer=-30 nm, and reflective layer=100 nm. The recording layer comprised Ge$_{22.2}$Sb$_{22.2}$Te$_{55.6}$, and an Al alloy was used for the reflective layer. In sputtering operation of forming each layer, the substrate was revolved along the circumference of a prescribed circle, with the target being fixed close to the circumference. The maximum distance between the substrate and the target was 23 cm. Further, a resin layer curable by ultraviolet irradiation having a thickness of about 3 to 5 μm was formed on the reflective layer by coating.

The first and second protective layers were formed by high-frequency sputtering (13.56 MHz) with the said composite target under a pressure of 0.4 Pa by flowing Ar gas at a rate of 50 sccm. The layer composition comprised yttrium, oxygen and sulfur with their ratios of the number of atoms being 48/39/13(%). The film density was a 4.2 g/cm$^3$, 84% of the theoretical. The JIS Knoop hardness of the film was 520, and its stress (tensile stress) was 5 E+8 dyn/cm$^2$. The refractive index of this film as measured by an ellipsometer was 2.1 at the wavelength of 780 nm. The recording layer and the reflective layer were formed by DC sputtering under an Ar gas pressure of 0.4 Pa. On the reflective layer was further provided an approximately 5 μm thick layer of an ultraviolet curing resin.

The above disc was initialized (crystallization of the recording layer) by an LD Bulk eraser of the wavelength of 810 nm and its dynamic properties were evaluated under the following conditions. With the disc turned at a linear velocity of 10 m/s and Pw was modulated between Pw and base power Pe at 4 MHz, 50% duty, and with LD of 780 nm wavelength and objective lens 0.55 NA as recording/reading light source, overwriting was conducted repeatedly at a recording power Pw of 16 mW, a base (erasing) power Fe of 12 mW and a reading power of 0.8 mW to determine the C/N ratio. The mark length was 2.5 μm. The recording power was adjusted to a power in which the secondary harmonic distortion was almost minimized. After 10$^5$ times of repetition of overwriting, C/N dropped 5.0% from the initial level while the noise rose 4.2%. The effective recording power Pwe calculated by making use of reflectance was 12 mW. When this disc was left under a high-temperature (80° C.) and high-humidity (85% RH, relative humidity) condition for 500 hours, there took place neither layer separation and nor any change of disc properties. These test results are shown in Table 1.

Example 2

The same procedure as defined in Example 1 was conducted except for the use of a 90:10 (mol %) mixed powder of Y$_2$O$_2$S and ZnO having an average particle size of about 8 μm and about 1 μm, respectively, as the starting material of hot pressing to make a target for forming the first and second protective layers. X-ray diffraction of the crystal structure of this target showed a diffraction peak of Y$_2$O$_2$S, but no detectable diffraction peak of ZnS and ZnO was observed. From this, it is considered that ZnO does not form crystal but remains mostly as a solid solution. Then, a phase-change optical disc was made in the same manner as defined in Example 1. The first and second layer composition comprised yattrium, oxygen, sulfur and zinc whose ratios of the number of atoms was 37/41/21/1 (%). The film density was 4.5 g/cm$^3$, 91% of the theoretical. The JIS Knoop hardness of the film was 530 and its stress (tensile stress) was 0.8 E+9 dyn/cm$^2$. The refractive index of this film as measured by an ellipsometer was 2.1 at the wavelength of 780 nm.

The dynamic properties of the disc was evaluated under the same conditions as defined in Example 1 except that the base power was set at 12.5 mW. The effective recording power Pwe was 13 mW. After 10$^5$ times of repetition of overwriting, C/N dropped 1.0% from the initial value, and the noise rose 2.2%. When this disc was left under a high-temperature (80° C.) and high-humidity (85% RH) condition for 500 hours, there took place neither fraction of films nor any change of disc properties. The test results are shown in Table 1.

Example 3

The same procedure as defined in Example 1 was carried out except for the use of a 50:50 (mol %) mixed powder of Y$_2$O$_2$S and ZnO having an average particle size of about 8 μm and about 1 μm, respectively, as the starting material of hot pressing to make a target for forming the first and second protective layers. Then a phase-change optical disc was made under the same manner as defined in Example 1. The first and second layer composition comprised yttrium, oxygen, sulfur and zinc with their number-of-atom ratios of 29/44/17/10 (%). The film density was 4.5 g/cm$^3$, 89% of the theoretical. The JIS Knoop hardness of the film was 490 and its stress (tensile stress) was 0.2 E+9 dyn/cm$^2$. The refractive index of this film as measured by an ellipsometer was 2.1 at the wavelength of 780 nm.

The dynamic properties of the disc were evaluated under the same conditions as defined in Example 1 except that the base power was set at 10 mW. The effective recording power Pwe was 12.3 mW. After 10$^5$ times of repetition of overwriting, C/N dropped 16% from the initial level and the noise rose 10%. When this disc was left under a high-temperature (80° C.) and high-humidity (85% RH) condition for 500 hours, there took place neither film fraction nor any change of disc properties. The results are shown in Table 1.

Comparative Example 1

The same procedure as defined in Example 1 was conducted except for the use of a 20:80 (mol %) mixed powder of Y$_2$O$_2$S and ZnO having an average particle size of about 8 μm and about 1 μm, respectively, as the starting material of hot pressing to make a target for forming the first and second protective layers. Then a phase-change optical disc was made under the same manner as defined in Example 1. The first and second protective layer composition comprised yttrium, oxygen, sulfur and zinc with their number-of-atom ratios of 15/47/10/28 (%). The film density was 4.7 g/cm$^3$, 88% of the theoretical. The JIS Knoop hardness of the film was 480, and its stress (compression stress) was 1.1 E+9 dyn/cm$^2$. The refractive index of this film as measured by an ellipsometer was 2.0 at the wavelength of 780 nm.

The dynamic properties of the disc were evaluated under the same conditions as defined in Example 1. The effective recording power Pwe was 12 mW. After $10^5$ times of repetition of overwriting, C/N dropped 29% from the initial level and the noise rose 20%. When the disc was left under a high-temperature (80° C.) and high-humidity (85% RH) condition for 500 hours, there took place neither film fraction nor any change of disc properties. These test results are shown in Table 1.

In the target used in this Comparative Example, ZnO was contained too excess comparing with $Y_2O_2S$ in the starting material of target. Therefore, $Y_2O_2S$ is substantially not contained in the target because of the reaction of $Y_2O_2S+ZnO \rightarrow Y_2O_3+ZnS$ at the calcining operation. Accordingly, $Y_2O_2S$ is substantially not contained in the protective layer (no metallic oxysulfide).

Comparative Example 2

The same procedure as defined in Example 1 was conducted except for the use of a 80:20 (mol %) mixed powder of ZnS and $SiO_2$ having an average particle size of about 4 μm respectively as the starting material of the hot pressing operation to make a target for forming the first and second protective layers. Then a phase-change optical disc was made under the same manner as defined in Example 1. The first and second layer composition comprised zinc, sulfur, silicon and oxygen with their number-of-atom ratios of 36/37/9/18 (%). The film density was 3.5 g/cm$^3$, 91% of the theoretical. The JIS Knoop hardness of the film was 280 and its stress (compression stress) was 1.1 E+9 dyn/cm$^2$. The refractive index of this film as measured by an ellipsometer was 2.1 at the wavelength of 780 nm.

The dynamic properties of the disc were evaluated in the same way as defined in Example 1. The effective recording power Pwe was 9.1 mW. After $10^5$ times of repetition of overwriting, C/N dropped 22% from the initial level and the noise rose 11%. When the disc was left under a high-temperature (80° C.) and high-humidity (85% RH) condition for 500 hours, there took place neither film separation nor any change of disc properties. These test results are shown in Table 1.

TABLE 1

|  | Example 1 | Example 2 | Example 3 |
| --- | --- | --- | --- |
| Target | $Y_2O_2S$ | $Y_2O_2S/ZnO = 90/10$ | $Y_2O_2S/ZnO = 50/50$ |
| Layer composition of protective layer | | | |
| Y (Si) | 48 | 37 | 29 |
| O | 39 | 41 | 44 |
| S | 13 | 21 | 17 |
| Zn | 0 | 1 | 10 |
| C/N drop percentage (%) | 5 | 1 | 16 |

TABLE 1-continued

| Noise rise percentage (%) | 4.2 | 2.2 | 10 |
| --- | --- | --- | --- |
| Durability | good | good | good |

|  | Comparative Example 1 | Comparative Example 2 |
| --- | --- | --- |
| Target | $Y_2O_2S/ZnO = 20/80$ | $ZnS/SiO_2 = 80/20$ |
| Layer composition of protective layer | | |
| Y (Si) | 15 | (9) |
| O | 47 | 18 |
| S | 10 | 37 |
| Zn | 28 | 26 |
| C/N drop percentage (%) | 29 | 22 |
| Noise rise percentage (%) | 20 | 11 |
| Durability | good | good |

Examples 4 and 5 and Comparative Example 3

On a 1.2 mm thick polycarbonate substrate having a guide groove (about 38 nm deep, about 550 nm wide and about 1.6 μm in pitch), a ZnS(80)/SiO$_2$(20) protective layer, a $Y_2O_2S$ protective layer, a $Ge_5Sb_{68}Te_{27}$ recording layer, a $Y_2O_2S$ protective layer, a ZnS(80)/SiO$_2$(20) protective layer and an Al alloy reflective layer were laminated in that order by sputtering in the manner described below and then an approximately 5 μm thick layer of an ultraviolet curing resin was provided on the reflective layer to manufacture a phase-change optical disc. Each layer was varied in thickness as shown in Table 2 to prepare the three types of disc (the discs of Examples 5 and 6 and the disc of Comparative Example 2).

In sputtering of each layer, the substrate was let revolve along the circumference of a prescribed circle and the target was fixed close to the circumference. The distance between the substrate and the target was 23 cm at the greatest. Each of the protective layers was formed by high-frequency (13.56 MHz) sputtering of the target under a pressure of 0.4 Pa by flowing Ar gas at a rate of 50 sccm, The recording layer and the reflective layer were formed by DC sputtering under an Ar gas pressure of 0.4 Pa.

TABLE 2

|  | Example 4 | Example 5 | Comparative Example 3 |
| --- | --- | --- | --- |
| First layer: ZnS—SiO$_2$ | 100 | 0 | 110 |
| Second layer: $Y_2O_2S$ | 10 | 105 | 0 |
| Third layer: GbSbTe | 17 | 17 | 17 |
| Fourth layer: $Y_2O_2S$ | 10 | 40 | 0 |
| Fifth layer: ZnS—SiO$_2$ | 30 | 0 | 40 |
| Sixth layer: Al alloy | 200 | 200 | 200 |

Figure 3:
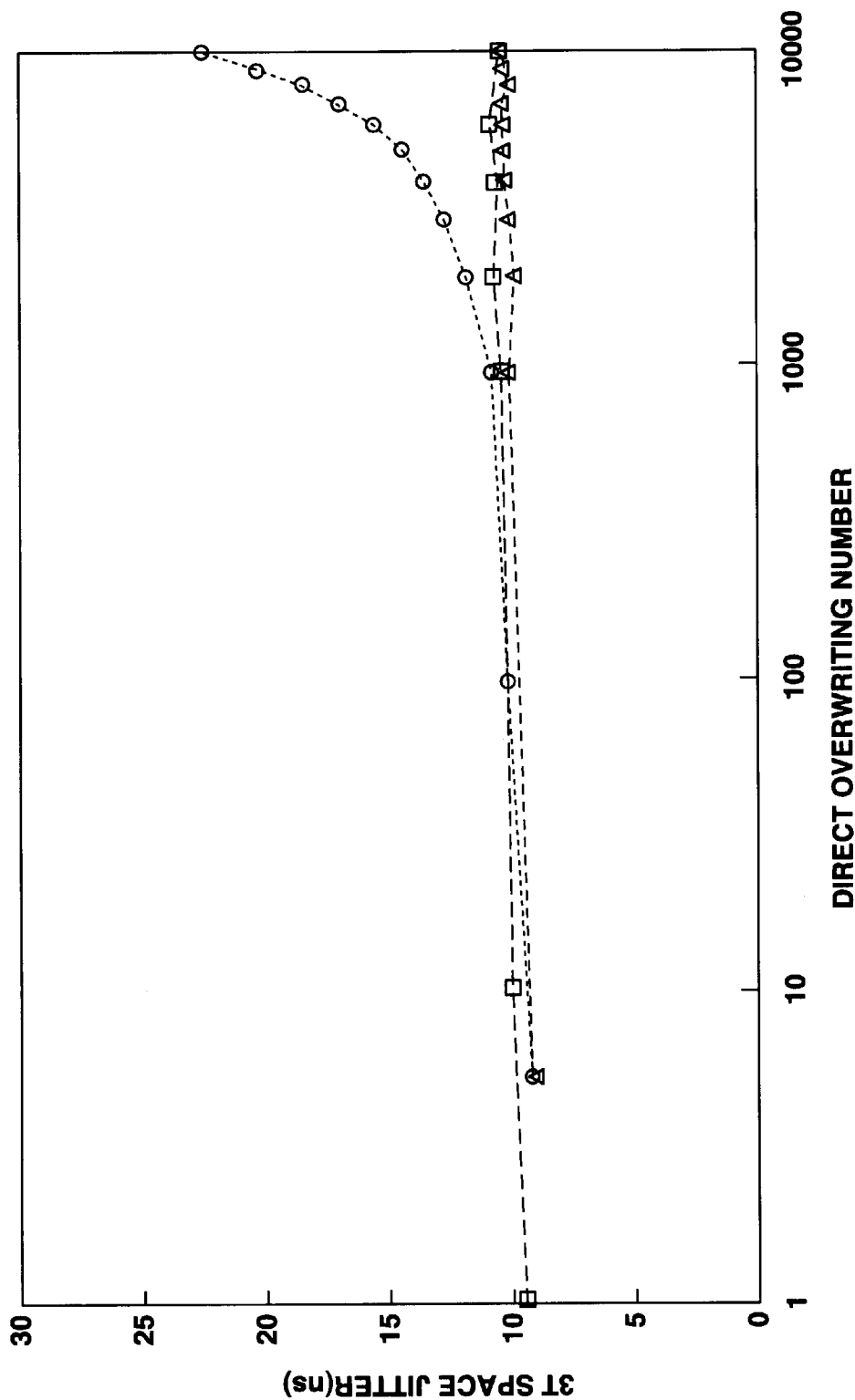
FIG. 3 is a graph showing the evaluation results (3T space jitter) of Examples 5 and 6 and Comparative Example 2.
Figure 4:
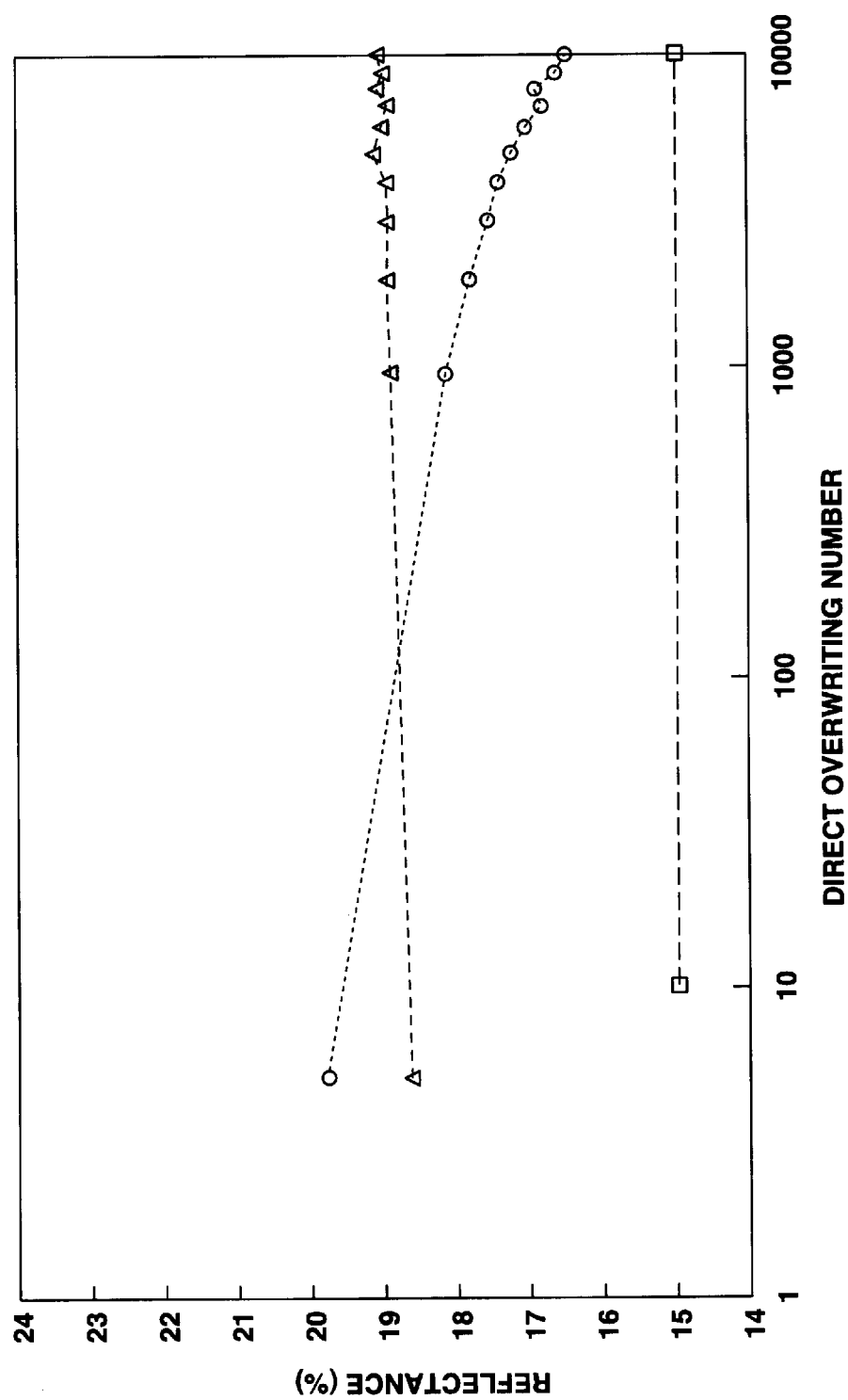
FIG. 4 is a graph showing the evaluation results (reflectance) of Examples 5 and 6 and Comparative Example 2.

After initializing each of the said three types of disc, the relation between the number of overwriting cycles and the 3T space jitter, reflectance and signal modulation was determined by the divided pulse method prescribed in the Orange Book Part 3 (specification for CD-RW), and the results were graphed in FIGS. 3 to 5, in which -Δ- denotes Example 4, -□- Example 5 and -○- Comparative Example 3. Signals were all recorded in the guide groove.

For the determinations, there was used an optical disc tester (DDU 1000 by Pulstec Co., Ltd.) having an optical system with laser wavelength of 780 nm and NA=0.55, and the determinations were made under the conditions of: linear velocity=2.4 m/s, ratio of erasing (base) power Pe to recording power Pw (Pe/Pw)=0.5. The mark length of 3T mark which is shortest mark was about 0.8 μm, where EFM mark length modulation code was used.

Signal modulation was defined as: {(reflectance of crystal portion)−(reflectance of 11T mark bottom portion)}/ (reflectance signal level of crystal portion). Recording power was set at 15 mW in Examples 4 and 5 and at 14 mW in Comparative Example 3, Due to the use of such recording power, the signal modulations of the respective discs were substantially equated to each other.

As is seen from FIGS. 3 to 5, the disc of Comparative Example 2 deteriorated in 3T space jitter and lowered in reflectance and signal modulation in less than 10,000 cycles of recording (overwriting). In contrast, the discs of Examples 5 and 6 suffered substantially no change of T space jitter, reflectance and signal modulation in 10,000 times of recording. With the disc of Example 5, as opposed to the disc of Example 6, it was possible to obtain the same degree of signal modulation by the same recording power despite high reflectance. This indicates that recording sensitivity can be improved by using a multi-layer of $Y_2O_2S$ and a composite layer of ZnS and $SiO_2$.

A phase-change optical disc was manufactured by depositing a ZnS(80)/$SiO_2$(20) protective layer (110 nm thick), a $Ge_5Sb_{68}Te_{27}$ recording layer (17 nm thick), a $Y_2O_2S$ protective layer (10 nm thick), a ZnS(80)/$SiO_2$(20) protective layer (30 nm thick) and an Al alloy reflective layer (200 nm thick) in this order on a substrate by sputtering, and after initialization, this disc was left under a high-temperature (80° C.) and high-humidity (85% RH) condition for 500 hours and then subjected to 1,000 times of overwriting. As a result, there took place neither layer fraction nor any change of disc properties. From this, it can be known that the layers of $Y_2O_2S$ and the layers of ZnS/$SiO_2$ are sufficiently stabilized in their properties including interfacial adhesion and also excellent in weather resistance. Thus, by laminating the layers of $Y_2O_2S$ and the layers of ZnS/$SiO_2$, it is possible to obtain a disc which excels in all of direct overwrite durability, recording sensitivity and weather resistance.

Example 6

A disc was produced and evaluated in the same way as defined in Example 1 except that a 18:72:10 (mol %) mixed powder of $Ce_2S_3$ (average particle size; about 5 μm), $CeO_2$ (average particle size: about 1 μm) and ZnO (average particle size; about 1 μm) was used as starting material, and that the base power was set at 10.3 mW in conducting evaluation. The effective recording power Pwe was 12 mW.

The film density of the protective layers was 5.8 g/cm³, 92% of the theoretical. The JIS Knoop hardness of the film was 620 and its stress (Compression stress) was 0.6 E+8 dyn/cm². The refractive index of the film as measured by an ellipsometer was 2.3 at the wavelength of 780 nm. The film composition comprised cerium, oxygen, sulfur and zinc with their number-of-atom ratios of approximately 33/47/17/3 (%). After $10^5$ times of repetition of overwriting, C/N dropped 3.7% from the initial level and the noise rose 1.3%, When this disc was left under a high-temperature (80° C.) and high-humidity (85% RH) condition for 500 hours, there took place neither film fraction nor any change of disc properties.

Example 7

A target for forming the first and second protective layers was made in the same way as defined in Example 1 except for the use of a 66.7/33.3 (mol %) mixed powder of $Y_2O_3$ and $Y_2S_3$, each having an average particle size of about 3 microns, as the starting material of the hot pressing process. In the X-ray diffraction analysis, no diffraction peak of $Y_2O_3$ and $Y_2S_3$ was observed but only $Y_2O_2S$ peak was observed. It is considered that almost pure $Y_2O_2S$ was formed. The density of the target was approx. 92% of the theoretical density. Then a phase-change optical disc was made under the same manner as defined in Example 1. The film density of the first and second protective layers was 4.4 g/cm³, 98% of the theoretical, and the composition was substantially same as Example 1. The JIS Knoop hardness of the film was 550 and its stress (tensile stress) was 5 E+4 dyn/cm². The refractive index of this film as measured by an ellipsometer was 2.1 at the wavelength of 780 nm.

The dynamic properties of the disc were evaluated under the same conditions as defined in Example 1 except that the recording power was set at 14 mW. After $10^5$ times of repetition of overwriting, C/N dropped 0.5% from the initial level and the noise rose 2.3%. The effective recording power Pwe calculated by making use of reflectance was 12 mW. When the disc was left under a high-temperature (80° C.) and high-humidity (85% RH) condition for 500 hours, there took place neither film fraction nor any change of disc properties.

Comparative Example 4

A phase-change optical recording medium was produced in the same way as defined in Example 1 except for the use of $Y_2O_3$ powder as the target material for the first and second protective layers. The film density of the first and second protective layers of this medium was 4.0 g/cm³, 83% of the theoretical. The JIS Knoop hardness of the film was 730 and its stress (compression stress) was 1.3 E+9 dyn/cm². The refractive index of this film as measured by an ellipsometer was 1.9 at the wavelength of 780 nm. When the medium was initialized by using Bulkeraser, film fraction was observed in the whole initialized area. It was unable to conduct the recording/retrieving repetition test.

Comparative Example 5

A phase-change optical recording medium was produced and evaluated in the same way as defined in Example 1 except that a ZnS/$Y_2O_3$=80/20 (mol %) mixed powder was used as the target material for the first and second protective layers, and that the recording power was set at 11 mW. The film density of the first and second protective layers of this medium was 4.1 g/cm³, 91% of the theoretical. The JIS Knoop hardness of the film was 350 and its stress (compression stress) was 1.5 E+9 dyn/cm². The refractive index of the film as measured by an ellipsometer was 2.2 at the wavelength of 780 nm. After $10^5$ times of repetition of overwriting, C/N dropped 21% from the initial level and the noise rose 15%.

Example 8

A phase-change optical disc was produced and evaluated in the same way as defined in Example 1 except that a powder comprising $Y_2O_2S$ having an average particle size of approximately 8 μm and ZnO having an average particle size of approximately 4 μm in a ratio of $Y_2O_2S$:ZnS=50:50 (mol %) was used as the material for the hot pressing, and the recording power and base (erasion) power were changed to of 17.3 mW and 10.5 mW, respectively. The effective recording power Pwe calculated by converting the reflectance was 13 mW.

The film density of the protective layer of this medium was 4.2 g/cm³, 90% of the theoretical. The JIS Knoop hardness of the film was 540 and its stress (tensile stress) was 3.5 E+8 dyn/cm². The refractive index of the film as measured by an ellipsometer was 2.1 at the wavelength of 780 nm. The film composition comprised yttrium, oxygen, sulfur and zinc with their number-of-atom ratios of approximately 42/41/12/5 (%). After $10^5$ times of repetition of overwriting, C/N dropped 3.1% from the initial level and the noise rose 1.5%. When the disc was left under a high-temperature (80° C.) and high-humidity (85% RH) condition for 500 hours, there took place neither film fraction nor any change of disc properties.

What is claimed is:

1. An optical recording medium having a protective layer and a phase-change recording layer, said protective layer being formed by sputtering using a target comprising a metallic oxysulfide, wherein the metallic oxysulfide comprises at least one rare earth metal, and wherein said target comprising at least 50 mol % of the metallic oxysulfide.

2. An optical recording medium according to claim 1, wherein the protective layer further contain a zinc compound.

3. An optical recording medium according to claim 2, wherein the zinc compound includes zinc sulfide.

4. An optical recording medium according to claim 3, wherein the zinc oxide content in the protective layer is not more than 30 mol %.

5. An optical recording medium according to claim 1, wherein there is provided another protective layer in contact with the protective layer to form a protective layer of a multilayer structure and said another protective layer has lower heat conductivity than the protective layer.

6. An optical recording medium according to claim 5, wherein the another protective layer contains a mixture of zinc sulfide and silicon oxide.

7. An optical recording medium having a protective layer and a phase-change recording layer on a substrate, wherein said protective layer is formed by sputtering using a target comprising at least 50 mol % of $Y_2O_2S$ or $Y_2O_2Se$;

wherein said protective layer comprises yttrium, oxygen, sulfur or selenium and if necessary other component(s); and wherein when the protective layer contains zinc, the number of atoms of zinc is smaller than the total number of atoms of sulfur and selenium.

8. An optical recording medium comprising a phase-change recording layer and protective layers provided on both sides of the phase-change recording layer, at least one of said protective layers being the protective layer as defined in claim 1 or 7.

9. An optical recording medium according to claim 8, wherein a substrate, a first protective layer, a phase-change recording layer, a second protective layer and a reflective layer are provided in this order, or a substrate, a reflective layer, a second protective layer, a phase-change recording layer and a first protective layer are provided in this order.

10. An optical recording medium according to claim 8, wherein there is provided another protective layer in contact with the protective layer to form a protective layer of a multilayer structure and said another protective layer has lower heat conductivity than the protective layer.

11. An optical recording medium according to claim 10, wherein the another protective layer contains a mixture of zinc sulfide and silicon oxide.

12. An optical recording medium according to claim 7, wherein the ratios of the number of atoms of yttrium (Y), oxygen (O), sulfur (S) or selenium (Se) and zinc (Zn) in the protective layer (Y:O:S or Se:Zn) are 25–50:30–50:10–30:0–20, the total of the ratios being 100.

13. An optical recording medium according to claim 7, wherein the ratio of the number of atoms of zinc (Zn) to the total number of atoms of sulfur and selenium (S+Se) is not more than 0.5.

14. An optical recording medium according to claim 7, wherein the protective layer contains $Y_2O_2S$.

15. An optical recording medium according to claim 7, wherein the protective layer contains a zinc compound.

16. An optical recording medium according to claim 15, wherein the zinc compound includes zinc sulfide.

17. An optical recording medium according to claim 15, wherein the zinc oxide content in the protective layer is not more than 30 mol %.

18. An optical recording medium according to claim 17, wherein the thickness of the first protective layer is 10 to 250 nm.

19. An optical recording medium according to claim 17, wherein the thickness of the second protective layer is 0.1 to 100 nm.

20. An optical recording medium according to claim 7, wherein there is provided another protective layer in contact with the protective layer to form a protective layer of a multilayer structure and said another protective layer has lower heat conductivity than the protective layer.

21. An optical recording medium according to claim 20, wherein the another protective layer contains a mixture of zinc sulfide and silicon oxide.

22. A method for producing an optical recording medium comprising forming a protective layer(s) on a substrate by sputtering with a target for forming protective layer, metallic oxysulfide being contained in said target for forming a protective layer, wherein the metallic oxysulfide comprises at least one rare earth metal.

23. The method according to claim 22, wherein the target comprising a metallic oxysulfide is obtained by sintering a mixture of an oxide of a metal and a sulfide of said metal.

24. A method according to claim 22, wherein said target contains a metallic oxysulfide consisting essentially of $Y_2O_2S$ and optionally ZnS, ZnO or a mixture thereof.

25. A method according to claim 22, wherein said target contains an oxysulfide of rare earth metal in an amount of at least 50 mol %.

* * * * *